(12) United States Patent
Mathe

(10) Patent No.: US 6,944,219 B2
(45) Date of Patent: Sep. 13, 2005

(54) LOW-POWER PROGRAMMABLE DIGITAL FILTER

(75) Inventor: Lennart Mathe, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 613 days.

(21) Appl. No.: 10/024,852

(22) Filed: Dec. 19, 2001

(65) Prior Publication Data

US 2002/0051502 A1 May 2, 2002

Related U.S. Application Data

(63) Continuation of application No. 09/211,990, filed on Dec. 14, 1998, now Pat. No. 6,389,069.

(51) Int. Cl.[7] .................................................. H04B 1/10
(52) U.S. Cl. ...................................... 375/232; 375/350
(58) Field of Search ............................... 375/142, 143, 375/150, 152, 229–233, 350; 708/323

(56) References Cited

U.S. PATENT DOCUMENTS

| | | | | |
|---|---|---|---|---|
| 5,404,375 A | * | 4/1995 | Kroeger et al. ............. | 375/142 |
| 5,694,422 A | * | 12/1997 | Kaku et al. .................. | 375/229 |
| 5,926,513 A | * | 7/1999 | Suominen et al. .......... | 375/346 |
| 5,963,273 A | * | 10/1999 | Boie et al. ................... | 348/725 |

* cited by examiner

*Primary Examiner*—Don N. Vo
(74) *Attorney, Agent, or Firm*—Philip R. Wadsworth; Charles D. Brown; George C. Pappas

(57) ABSTRACT

A low power programmable digital filter adapted for use with a telecommunications system transceiver. The digital filter includes a first finite impulse response filter section for receiving an input signal and having a first transfer function. An infinite impulse response filter section is connected to the first finite impulse response filter section and has a second transfer function. A second finite impulse response filter section is connected to the infinite impulse response filter section and outputs a filtered output signal in response the receipt of the input signal by the programmable digital filter. The second finite impulse response filter section has a third transfer function. A programmable coefficient is included in the first, second, and/or the third transfer function.

14 Claims, 6 Drawing Sheets

LOW-POWER PROGRAMMABLE DIGITAL FILTER

RELATED APPLICATIONS

This is a continuation of U.S. Pat. Ser. No. 09/211,990, filed Dec. 14, 1998, now U.S. Pat. No. 6,389,069.

BACKGROUND OF THE INVENTION

1. Field of Invention

This invention relates to digital circuits. Specifically, the present invention relates to programmable digital filters for use in telecommunications systems.

2. Description of the Related Art

Digital filters are used in a variety of demanding applications ranging from electronic control systems to cellular telecommunications systems. Such applications often require programmable digital filters that consume minimal power.

Digital filter programmability and low power consumption are particularly important in digital cellular telecommunications systems such as code division multiple access (CDMA) systems. A typical CDMA cellular telecommunications system is characterized by a plurality of mobile transceivers in communication with one or more base stations. Signals transmitted by the mobile transceivers are received by a base station and often relayed to a mobile switching center (MSC). The MSC in turn routes the signal to another base station, a public switched telephone network (PSTN) or to another mobile transceiver. Similarly, the public switched telephone network may transmit a signal to a mobile unit via a base station and a mobile switching center.

It is often advantageous to employ different sampling rates within the mobile transceiver, base station, and/or MSC. To accommodate different sampling rates, digital filters located within the mobile transceiver, base station, and/or MSC are often programmable. Filter programmability also reduces the need to replace expensive hardware when mobile transceiver specifications change.

In a typical programmable digital filter, several registers or delay circuits are connected in series. The outputs of the registers are connected to parallel programmable gain circuits having gains related to filter transfer function coefficients. The outputs of the gain circuits are input to multipliers connected in series. The filter design often requires many expensive digital multipliers that consume excess power and occupy valuable circuit board space. The digital multipliers result in large filter power consumption and decreased mobile transceiver battery life.

Hence a need exists in the art for a space-efficient low-power programmable digital filter that can accommodate a range of input frequencies or sample rates. There is a further need for a power-efficient transceiver incorporating a low-power programmable digital filter.

SUMMARY OF THE INVENTION

The need in the art is addressed by the programmable digital filter of the present invention. In the illustrative embodiment, the inventive filter is adapted for use with a transceiver and includes a first finite impulse response filter section for receiving an input signal. The first finite impulse response filter section has a first transfer function. An infinite impulse response filter section is connected to the first finite impulse response filter section and has a second transfer function. A second finite impulse response filter section is connected to the infinite impulse response filter section and outputs a filtered output signal in response the receipt of the input signal by the programmable digital filter. The second finite impulse response filter section has a third transfer function. A programmable coefficient is provided in the first, second, and/or the third transfer functions.

In a specific embodiment, the first transfer function has a first programmable coefficient. The second transfer function has a second programmable coefficient and the third transfer function has a third programmable coefficient. The programmable digital filter further includes a processor for providing a control signal. A memory provides the first, second, and/or third programmable coefficients in response to the control signal. A high-pass filter section provides input to the first finite impulse response filter section. A multiplexer selectively bypasses the high-pass filter in response to a bypass control signal from the processor. The processor generates the bypass control signal in response to DC offsets, i.e., biases occurring in the input signal.

In the illustrative embodiment, the first finite impulse response filter section includes a first jammer filter, a second jammer filter, and a third jammer filter for removing telecommunications jammer signals in the input signal. The first, second, and third jammer filters have first, second, and third jammer filter transfer functions with the first programmable coefficient, a fourth programmable coefficient, and a fifth programmable coefficient, respectively. The finite impulse response filter section further includes a first bit truncation circuit, a second bit truncation circuit, and a third bit truncation circuit at the outputs of the first, second and third jammer filters, respectively. In one exemplary embodiment of the invention the first, second, and third bit truncation circuits remove three most significant bits and three least significant bits from an input code word. The first bit truncation circuit is connected in series at an output of the first jammer filter. The second bit truncation circuit is connected in series between the first jammer filter and the second jammer filter. The third bit truncation circuit is connected in series between the second jammer filter and the third jammer filter.

The infinite impulse response filter section includes a first equalization filter and a second equalization filter. An input of the first equalization filter is connected to an output of the first finite impulse response filter section. The first equalization filter has two programmable coefficients and the second equalization filter has one programmable coefficient. A bias and gain correction circuit removes any bias in the output signal and adjusts the gain of the output signal.

The bias and gain correction circuit includes a subtractor for subtracting a bias from the output signal and providing an offset-compensated signal in response thereto. The bias and gain correction circuit removes a predetermined number of least significant bits from a code word in the offset-compensated signal and providing a bit-corrected signal in response thereto. The bias and gain correction circuit further includes a multiplier for multiplying the bit-corrected signal by a predetermined factor and providing a gain-adjusted signal in response thereto. The bias and gain correction circuit removes a first predetermined number of least significant bits and a second predetermined number of most significant bits from a code word in the gain-adjusted signal and provides a programmable digital output filter output signal in response thereto.

In the illustrative embodiment, the programmable digital filter is implemented in a telecommunications system receiver that includes an antenna for receiving a radio signal having a first frequency. A mixer mixes the radio signal to an intermediate frequency signal. A delta-sigma analog-to-digital converter converts the intermediate frequency signal to a digital intermediate frequency signal. A digital filter includes the programmable digital filter and converts the digital intermediate frequency signal to a digital baseband signal characterized by a (chip rate)*8 sample rate. A baseband processor processes the digital baseband signal at the chip rate.

The novel design of the present invention is facilitated by the separation of functionality of the programmable digital filter into various sections such as the infinite impulse response filter sections and the finite impulse response filter sections. By separating filter functionality into several blocks and providing strategic programmable coefficients for each block, control over the composite transfer function of the programmable digital filter is maximized while minimizing power consumption of the programmable digital filter.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
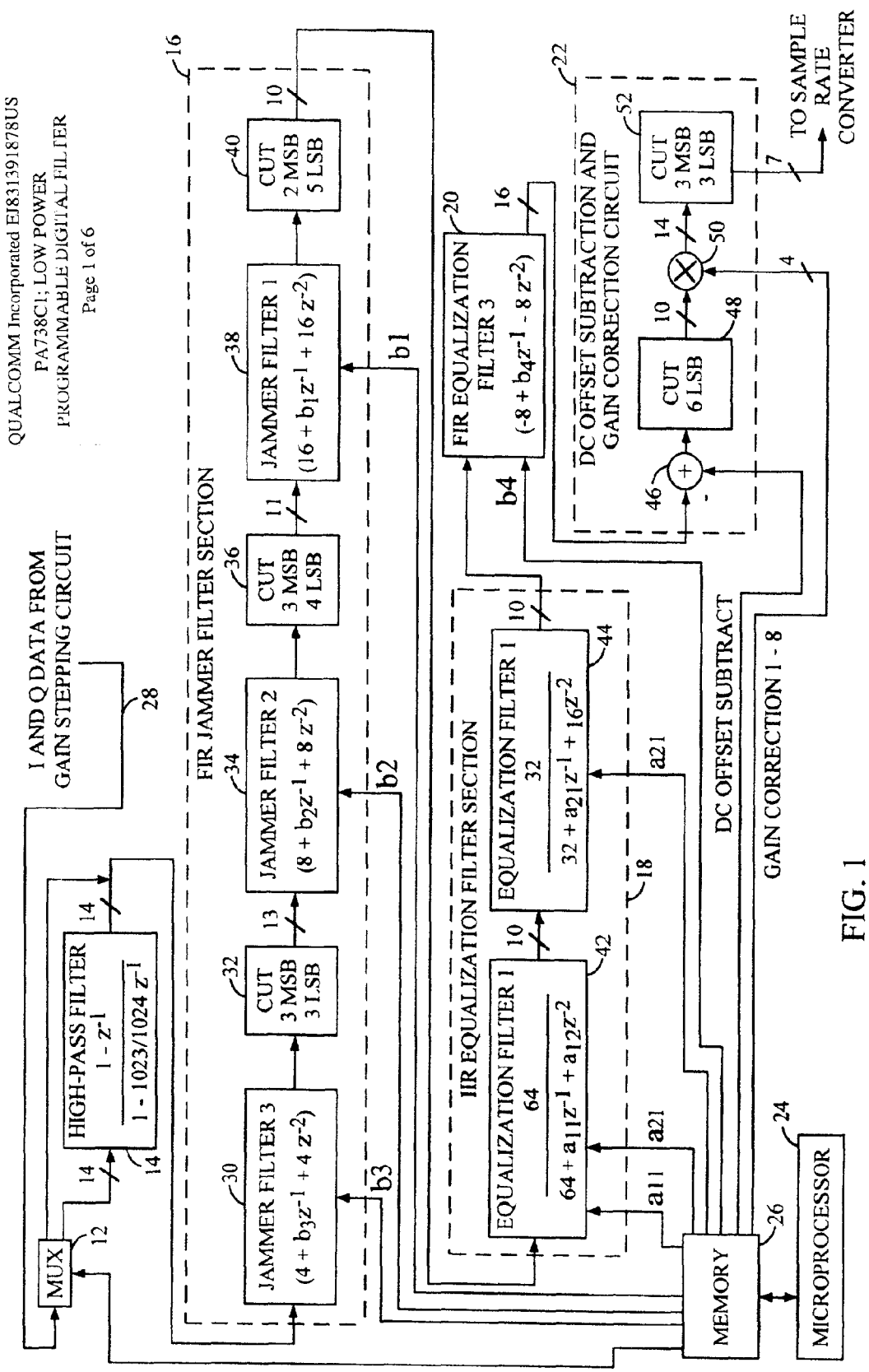
FIG. 1 is a block diagram of a programmable digital filter constructed in accordance with the teachings of the present invention.

FIG. 1 is a block diagram of a programmable digital filter 10 constructed in accordance with the teachings of the present invention. The programmable digital filter 10 includes an input multiplexer 12, a high-pass filter 14, a finite impulse response (FIR) jammer filter section 16, an infinite impulse response (IIR) equalization filter section 18, an FIR equalization filter 20, and a direct current (DC) offset subtraction and gain correction circuit 22. Various operational parameters of the programmable digital filter 10 are controlled via a microprocessor 24 and an associated memory 26. The parameters are stored in the memory 26 which is connected to the input multiplexer 12, the FIR jammer filter section 16, the IIR Equalization filter section 18, the equalization filter 20, and the DC offset subtraction and gain correction circuit 22.

The input multiplexer 12 receives an input signal 28 containing in-phase (I) and/or quadrature (Q) data from a preceding gain stepping circuit and decimation filters (as discussed more fully below). Those skilled in the art will appreciate that the programmable digital filter 10 may be preceded by another type of circuit other than a gain stepping circuit without departing from the scope of the present invention.

The input multiplexer 12 selectively bypasses the high-pass filter 14 in response to a control signal from the microprocessor 24 and associated memory 26. The microprocessor memory 26 stores pre-existing information as to whether or not the data input to the multiplexer contains DC offsets and/or other signal components that must be attenuated via the high-pass filter 14.

In the present specific embodiment, the transfer function of the high-pass filter 14 is:

$$(1-z^{-1})/(1-(1023/1024)z^{-1}) \quad [1]$$

where z is a complex variable in the z-domain. The transfer function [1] is designed to remove DC offsets. The DC offsets may arise from a preceding delta-sigma ($\Delta\Sigma$) modulator or other components in a radio frequency (RF) front end of a receiver in which the programmable digital filter 10 is employed (as discussed more fully below). The high-pass filter 14 is bypassed via the multiplexer 12 to save power in the event that no DC offsets are present in the input signal 28.

The output of the high-pass filter 14 is connected to the input of the FIR jammer filter section 16. The FIR jammer filter section 16 includes, from left to right, a third jammer filter 30, a first bit truncation circuit 32, a second jammer filter 34, a second bit truncation circuit 36, a first jammer filter 38, and a third bit truncation circuit 40.

In operation, the output of the high-pass filter 14 is input to the third jammer filter 30. The third jammer filter 30 operates on the input in accordance with the following transfer function:

$$4+b_3 z^{-1}+4z^{-2} \quad [2]$$

where $b_3$ is a programmable coefficient that is provided by the microprocessor 24 and microprocessor memory 26. In the present embodiment, $b_3$ is in the range of 12 to 4 for CDMA signals and is 6 for frequency modulation (FM) signals. The first and last coefficients, i.e., 4 and 4 are powers of 2, making the implementation of the jammer filter 30 inexpensive and straight-forward to implement by those ordinarily skilled in the art.

In the present specific embodiment, the output signal from the third jammer filter 30 is input to the first bit truncation circuit 32 where three (3) most significant bits (MSBs) and three (3) least significant bits (LSBs) are truncated from the signal, are saturated. The number of bits that are saturated, is application specific and those ordinarily skilled in the art may easily adjust the number of truncated bits to meet the needs for a given application. The design and construction of bit truncation circuits are well known in the art.

The resulting truncated signal is input to the second jammer filter 34. The second jammer filter 34 operates on the truncated signal in accordance with the following transfer function:

$$8+b_2 z^{-1}+8z^{-2} \quad [3]$$

where $b_2$ is a programmable coefficient that is provided by the microprocessor 24 and microprocessor memory 26. In the present embodiment, $b_2$ is in the range of 16 to 24 for CDMA signals and is 7 for FM signals. The first and last coefficients, i.e., 8 and 8 are powers of 2, making the implementation of the jammer filter 34 inexpensive and straight-forward to implement by those ordinarily skilled in the art.

The output signal from the second jammer filter 34 is input to the second bit truncation circuit 36 where three (3) MSBs and four (4) LSBs are truncated from the signal. The resulting truncated signal is input to the first jammer filter 38. The first jammer filter 38 operates on the truncated signal in accordance with the following transfer function:

$$16+b_1 z^{-1}+16z^{-2} \quad [4]$$

where $b_1$ is a programmable coefficient that is provided by the microprocessor 24 and microprocessor memory 26. In the present embodiment, $b_1$ is in the range of 22 to 2 for CDMA signals and is five (5) for FM signals. The first and last coefficients, i.e., 16 and 16 are powers of two (2), making the implementation of the jammer filter 38 inexpensive and straight-forward to implement by those ordinarily skilled in the art.

The output signal from the first jammer filter 38 is input to the third bit truncation circuit 40 where 2 MSBs and 5 LSBs are truncated from the signal. The resulting truncated signal is output from the FIR jammer filter section 16 to the IIR equalization filter section 18. The IIR equalization filter section 18 includes, from left to right, a first IIR equalization filter 42 and a second IIR equalization filter 44.

After the input signal 28 is processed by the high-pass filter 14 and the FIR jammer filter section 16, the passband is drooped, i.e., drops off or sags at the higher frequency end of the passband. The following IIR equalization filter section 18 and FIR equalization filter 20 remove the passband droop and equalizes the phase response.

The first IIR equalization filter 42 operates on the output of the FIR jammer filter section 16 in accordance with the following transfer function:

$$64/(64+a_{11} z^{-1}+a_{12} z^{-2}) \quad [5]$$

where $a_{11}$ and $a_{12}$ are programmable coefficients that are provided by the microprocessor 24 and microprocessor memory 26. In the present embodiment, $a_{11}$ is in the range of 15 to −42 for CDMA signals and is 0 for FM signals, while $a_{12}$ is in the range of 40 to 54 for CDMA signals and is 0 for FM signals. The non-programmable coefficients, i.e., 64 are powers of 2, making the first IIR equalization filter 42 inexpensive to implement.

The output of the first IIR equalization filter 42 is input to the second equalization filter 44. The first IIR equalization filter 42 operates on the output of the FIR jammer filter section 16 in accordance with the following transfer function:

$$32/(32+a_{21} z^{-1}+16z^{-2}) \quad [6]$$

where $a_{21}$ is a programmable coefficient that is provided by the microprocessor 24 and microprocessor memory 26. In the present embodiment, $a_{21}$ is in the range of 2 to −22 for CDMA signals and is −27 for FM signals. The non-programmable coefficients, i.e., 16 and 32 are powers of 2, making the first IIR equalization filter 42 inexpensive to implement.

The output of the second IIR equalization filter 44 is input from the IIR equalization section 18 to the FIR equalization filter 20. The FIR equalization filter 20 operates on the output of the IIR equalization filter section 18 in accordance with the following transfer function:

$$-8+b_4 z^{-1}-8z^{-2} \quad [7]$$

where $b_4$ is a programmable coefficient that is provided by the microprocessor 24 and microprocessor memory 26. In the present embodiment, $b_4$ is in the range of 32 to 44 for CDMA signals and is 29 for FM signals. The non-programmable coefficients, i.e., −8 are powers of 2, making the FIR equalization filter 20 inexpensive to implement.

The output of the FIR equalization filter 20 is input to the DC offset subtraction and gain correction circuit 22. The DC offset subtraction and gain correction circuit 22 includes, from left to right, a DC offset subtractor 46, a fourth bit truncation circuit 48, a gain correction multiplier 50, and a fifth bit truncation circuit 52.

In operation, the DC offset subtractor 46 receives the output of the FIR equalization filter 20 and subtracts a DC offset value provided by the microprocessor 24 and associated memory 26. The microprocessor 24 maintains pre-existing information about DC offsets occurring in the output of the FIR equalization filter 20 via the memory 26. The construction of the microprocessor 24 and memory 26 is well known in the art.

Once any DC offsets are subtracted from the signal by the DC offset subtractor 46, six LSBs are truncated from the signal by the fourth bit truncation circuit 48. The resulting truncated signal is input to the gain correction multiplier 50. The gain correction multiplier 50 multiplies the truncated signal by a gain factor stored in the memory 26. In the present embodiment, the gain factor is in the range of 1 to 8.

The resulting gain-adjusted signal is input to the fifth bit truncation circuit 52 where 3 MSBs and 3 LSBs are truncated from the signal. The resulting truncated signal is output from the DC offset subtraction and gain correction circuit 22 and represents the output of the programmable digital filter 10. The output of the programmable digital filter is forwarded to a sample rate converter (as discussed more fully below).

The DC offset subtraction and gain correction circuit 22 is intended to subtract out DC offsets introduced by bit truncations throughout the programmable digital filter 10 and throughout the circuit in which the programmable digital filter 10 is employed. Because DC offsets introduced by different circuit sections will have different characteristics depending on the DC gain of the various stages, DC offset subtraction implemented by the DC offset subtractor 46 is programmable and controlled via the microprocessor 24.

Gain correction is implemented via the gain correction multiplier 50 that multiplies the jammer filtered signal output from the fourth bit truncation circuit 48 with a constant ranging from 1 to 8. After bit truncations performed by the fifth bit truncation circuit 52, the effective gain provided by the gain correction multiplier 50 ranges from ⅛ to 1. The gain adjustment makes the gain of the programmable digital filter 10 approximately constant regardless of the sampling frequency of the input signal 28. In addition, the programmable gain facilitates optimization of signal levels within the programmable stages 30, 34, 38, 42, 44 and 20 to minimize the number of bits required by each stage. Minimizing the number of required bits further improves the power efficiency of the programmable digital filter 10.

The novel design of the present invention is facilitated by the separation of jammer rejection into three jammer filters 30, 34 and 38, each having a transfer function with a programmable coefficient. This provides control over the filtering characteristics of the programmable digital filter 10 while requiring a minimum of power.

The programmable digital filter 10 is adapted for use with a mobile transceiver receiver system (as discussed more fully below). The transfer functions corresponding to equations [2] through [7] are designed to attenuate jammers and other interference. For frequencies greater than approximately 900 kHz the transfer functions provide more than 60 dB of attenuation. In addition, the transfer functions equalize the phase of the input signal 28 so that the total mean squared error when combined with base station phase prewarping does not exceed a predetermined value. The passband is equalized so that the total frequency response of the programmable filter 10 is approximately flat in the passband.

The input signal 28 has a sampling rate of F $\Delta\Sigma/24$, where F $\Delta\Sigma$ is the sampling rate of a preceding $\Delta\Sigma$ modulator (as discussed more fully below). F $\Delta\Sigma/24$ is in the range of 2.5 to 3.3 MHz. The desired passband of the signal 28 is fixed at 0 to 630 kHz. The stopband comprises all frequencies greater that approximately 900 kHz. The sampling rate of the input signal 28 varies with the location of the passband and stopband edges. The programmability of the programmable filter 10 facilitates accommodation of the varying sampling rate. The programmable filter 10 maximizes control over the filter frequency response given stringent power consumption requirements. Implementation of additional programmable coefficients in the programmable filter 10 would require additional multipliers, which consume additional power.

Figure 2:
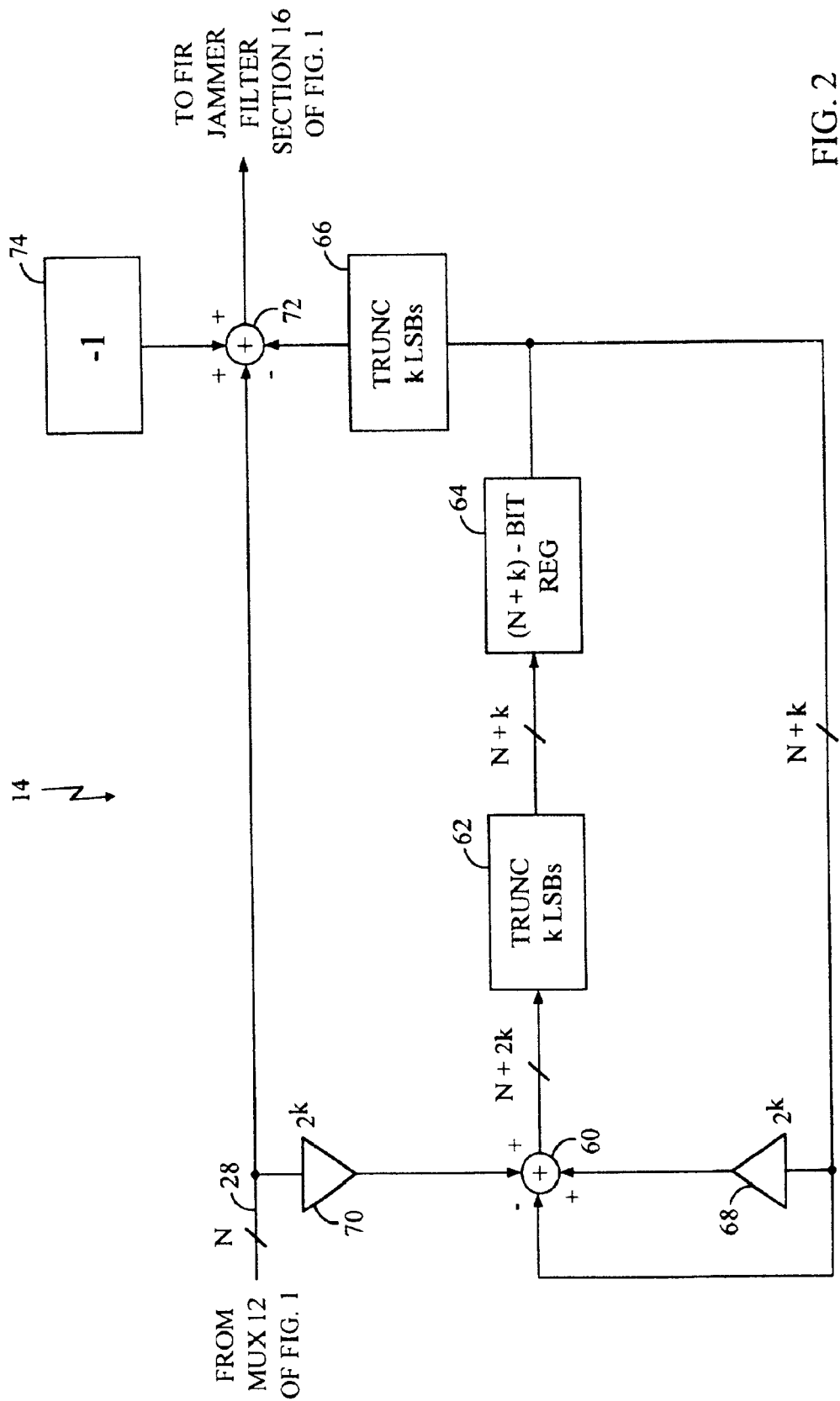
FIG. 2 is more detailed diagram of the high-pass filter of FIG. 1.

FIG. 2 is more detailed diagram of the high-pass filter 14 of FIG. 1. The high-pass filter 14 includes a first subtractor 60, the output of which is connected to a first k-bit truncation circuit 62. The output of the first k-bit truncation circuit 62 is connected to a (N+k)-bit register 64. The output of the (N+k)-bit register is connected to the input of a second k-bit truncation circuit 66, a $2^k$ multiplier 68, and a negative input of the first subtractor 60. The output of the $2^k$ multiplier 68 is input to a positive input of the first subtractor 60. Another positive input of the first subtractor 60 is connected to the output of a second $2^k$ multiplier 70 that receives the N-bit input 28 as input.

The output of the second k-bit truncation circuit 66 is connected to a negative input of a second subtractor 72. A first positive input of the second subtractor 72 is also connected to the N-bit input 70. A second positive input of the second subtractor 72 is connected to a –1 register 74 that supplies a –1 to the second subtractor 72 to subtract out truncation bias introduced by the k-bit truncation circuits 62 and 66.

The first and second subtractors 60 and 72, respectively, subtract the values at the negative inputs from the sum of the values at the positive inputs. The first k-bit truncation circuit 62 and the second k-bit truncation circuit truncate k LSBs from the corresponding input signal, where k is a design constant. The first $2^k$ multiplier 68 and the second $2^k$ multiplier 70 multiply their respective input signals by $2^k$ and provide corresponding outputs in response thereto. The $2^k$ multipliers 68 and 70 may be implemented with simple left-shift circuits.

The high-pass filter 14 removes any DC component in the input signal 28 via a pole with location p as expressed in the following equation:

$$p=(2^{k-1}-1)/(2^{k-1}) \qquad [8]$$

For a 1 dB frequency of 1 kHz with the sampling rate of the input signal 28 equal to F $\Delta\Sigma/24$, k=10 and p=1023/1024.

Figure 3:
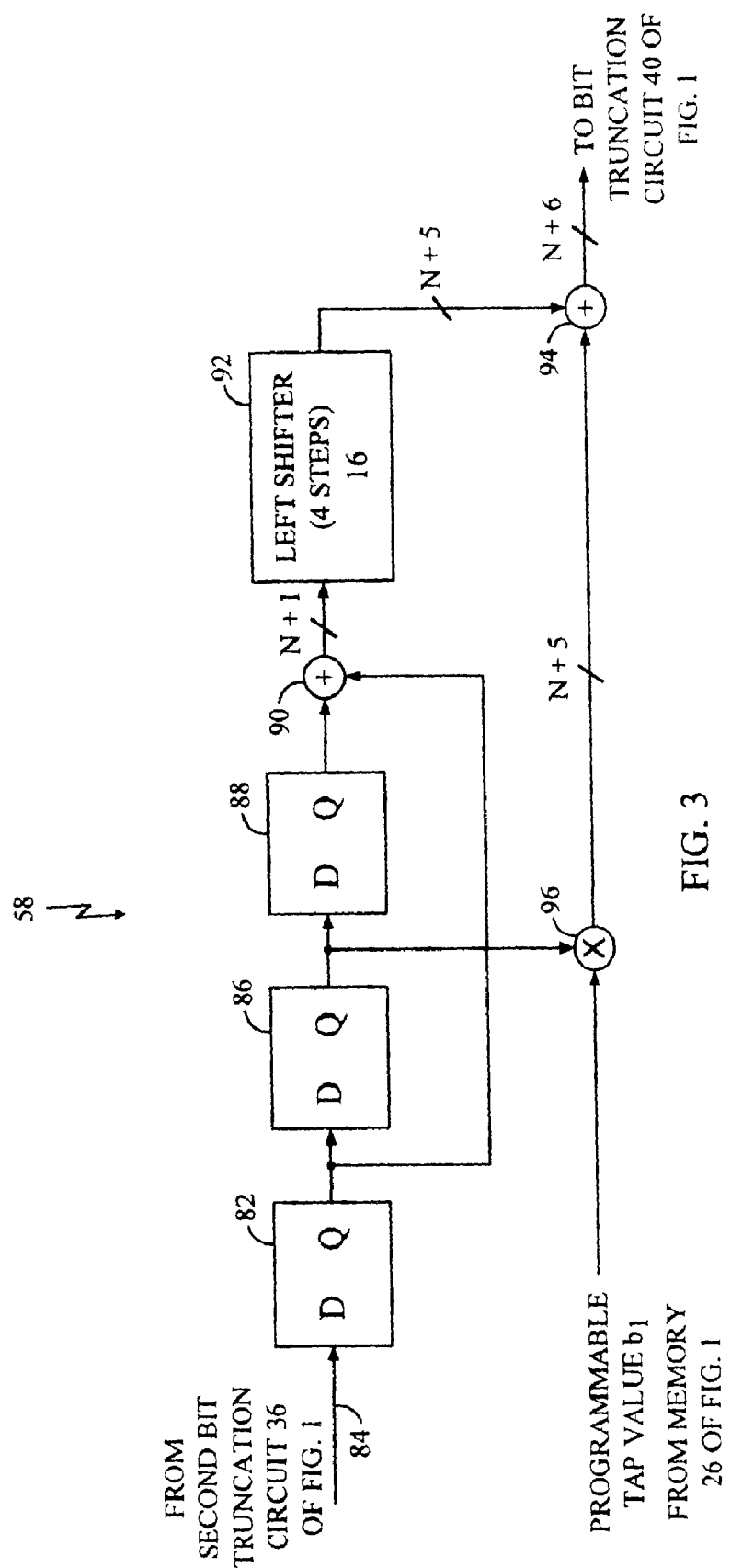
FIG. 3 is a diagram depicting the architecture of the FIR jammer filters of the FIR jammer filter section and the FIR equalization filter of FIG. 1.

FIG. 3 is more detailed diagram of the FIR jammer filter 38 of FIG. 1. The architecture of the FIR jammer filter 38 is similar to the architecture of the FIR jammer filters 30, 34 of the FIR jammer filter section 16 and the FIR equalization filter 20 of FIG. 1. The FIR jammer filter 38 includes a first N-bit register 82 for receiving an N-bit input signal 84. In the present embodiment, N is 11. A second N-bit register 86 is connected to the output of the first N-bit register 82. A third N-bit register 88 is connected to the output of the second N-bit register 86. An input of a first adder 90 is connected to the output of the third N-bit register 88. A second input of the first adder 90 is connected to the output of the first N-bit register 82, which is also the input of the second N-bit register 86. The output of the first adder 90 is connected to a left-shift circuit 92 that shifts input signals by four bits. The output of the left-shift circuit 92 is connected to an input of a second adder 94. A second input of the second adder 94 is connected to the output of a coefficient multiplier 96. A first input of the coefficient multiplier 96 receives a programmable tap value from a microprocessor via a memory device such as a register (see FIG. 1). A second input of the coefficient multiplier is connected to the output of the second N-bit register 86, which is also the input of the third N-bit register 88.

The FIR jammer filter 38 implements the transfer function of equation [4]. Those skilled in the art can easily modify the FIR jammer filter 38 to construct the other FIR filters 30, 34, and 20.

The low frequency gain of the FIR jammer filter 38 is dependent on the programmable coefficient b1. In the present embodiment the gain ranges from 32 to 64. Note that the number of bits grows inside the FIR jammer filter 38.

Figure 4:
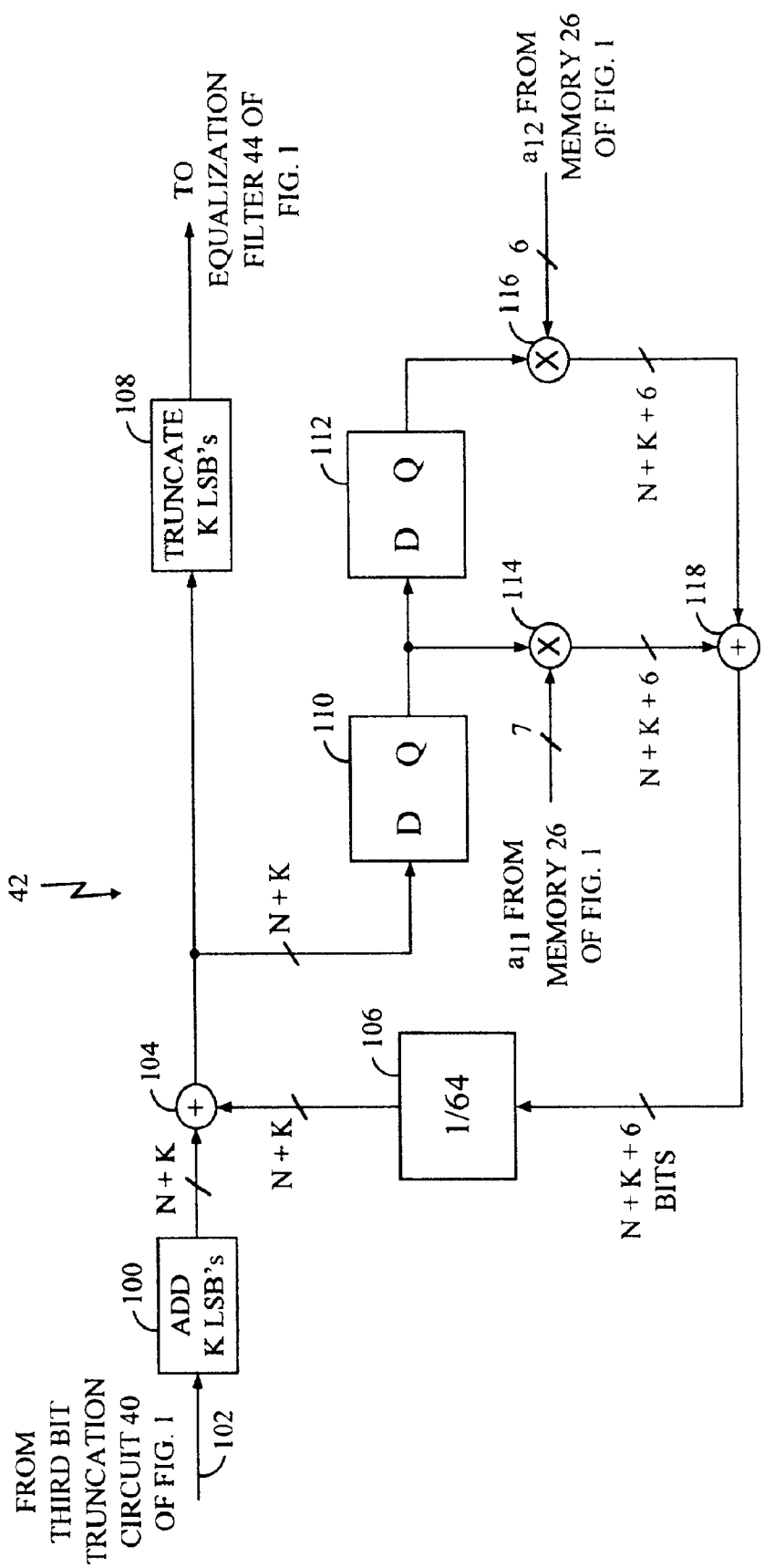
FIG. 4 is a diagram depicting the architecture of the IIR equalization filters of the IIR equalization filter section of FIG. 1.

FIG. 4 is a more detailed diagram of the first IIR equalization filter 42 of FIG. 1. The architecture of the IIR equalization filter 42 is similar to the architecture of the second IIR equalization filter 44 of FIG. 1. The first IIR equalization filter 42 receives an N-bit input 102 to a K-LSB adder circuit 100. The output of the K-LSB adder circuit 100 is input to a (N+K)-bit adder 104. The output of a 6-LSB truncation circuit 106 is also input to the (N+K)-bit adder 104. The output of the (N+K)-bit adder 104 is connected to the input of a K LSB truncation circuit 108 and to a first (N+K)-bit register 110. The output of the K LSB truncation circuit 108 provides the output of the first IIR equalization filter 42. The output of the (N+K)-bit register 110 is connected to the input of a second (N+K)-bit register 112 and to the input of an $a_{11}$ coefficient multiplier 114. Another input of the $a_{11}$ coefficient multiplier 114 receives the $a_{11}$ coefficient from the microprocessor memory 26 of FIG. 1. The output of the second (N+K)-bit register 112 is connected to a first input of an $a_{12}$ coefficient multiplier 116. A second input of the $a_{12}$ coefficient multiplier 116 receives the $a_{12}$ coefficient from the microprocessor memory 26 of FIG. 1. Outputs of the $a_2$ coefficient multiplier 116 and the $a_{12}$ coefficient multiplier 116 are provided to the inputs of an (N+K+6) bit adder 118. The output of the (N+K+6) bit adder 118 is connected to the input of the 6-LSB truncation circuit 106.

The K-LSB adder circuit 100 extends an input code word occurring in the N-bit input 102 by K LSBs. The additional K LSBs are set to zero and truncated by the K-LSB truncation circuit 108 at the output of the IIR equalization filter 42. The value of K varies in accordance with the requirements of a given application and is determined by circuit simulations. In the present specific embodiment, K=0.

The (N+K)-bit adder 104 and the (N+K+6) bit adder 118 are saturating adders. If a bit overflow occurs, the adders set their outputs to either the maximum positive value or the minimum negative value the adders can handle.

The coefficients $a_{11}$ and $a_{12}$, input to the $a_{11}$ coefficient multiplier 114 and the $a_{12}$ coefficient multiplier 116, respectively, range from −45 to 15 and from 40 to 54 respectively. The gain of the IIR equalization filter 42 is dependent on the coefficients $a_{11}$ and $a_{12}$. $a_{11}$ strongly influences the gain, while $a_{12}$ has minor influence. In a worst case scenario, if $a_{12} < 54$, the resulting gain will be less than a factor of 8. In this case, the N-bit input signal 102 must have 3 extra bits to assure that overflow will not occur in the IIR equalization filter 42, i.e., to assure that the resulting filter output is appropriately expressed with the N provided bits.

Figure 5:
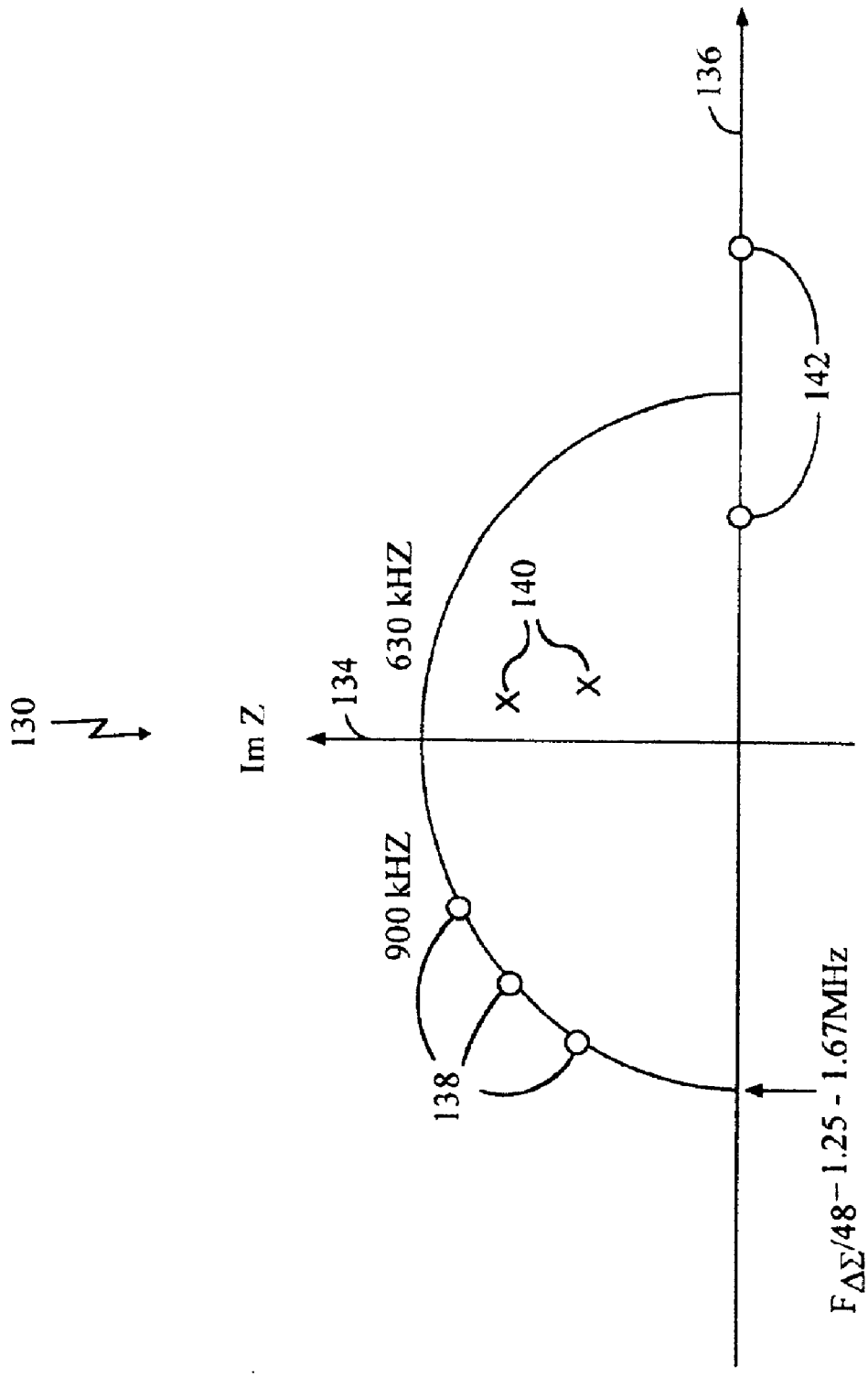
FIG. 5 is a pole-zero plot of the transfer function of the programmable digital filter of FIG. 1 not including the high-pass filter.

FIG. 5 is a pole-zero plot 130 of the transfer function of the programmable digital filter of FIG. 1 not including the high-pass filter 14 of FIG. 1. The pole-zero plot 130 depicts the upper half of a unit circle 132 and includes an imaginary axis 134 and a real axis 136. Three zeros 138 on the unit circle 132 are spread over the stopband frequencies from 900 kHz to 1.67 MHz. The three zeros 138 originate from the first 38, second 34 and third 30 jammer filters and are placed on the unit circle 132 for maximum jammer attenuation. Two poles 140 located near the passband edge at 630 kHz compensate for passband droop and help to equalize filter phase response. The two poles 140 originate from the IIR equalization filter section 18. Two zeros 142 on the real axis 136 help to further compensate for passband droop and originate from the FIR equalization filter 20

Figure 6:
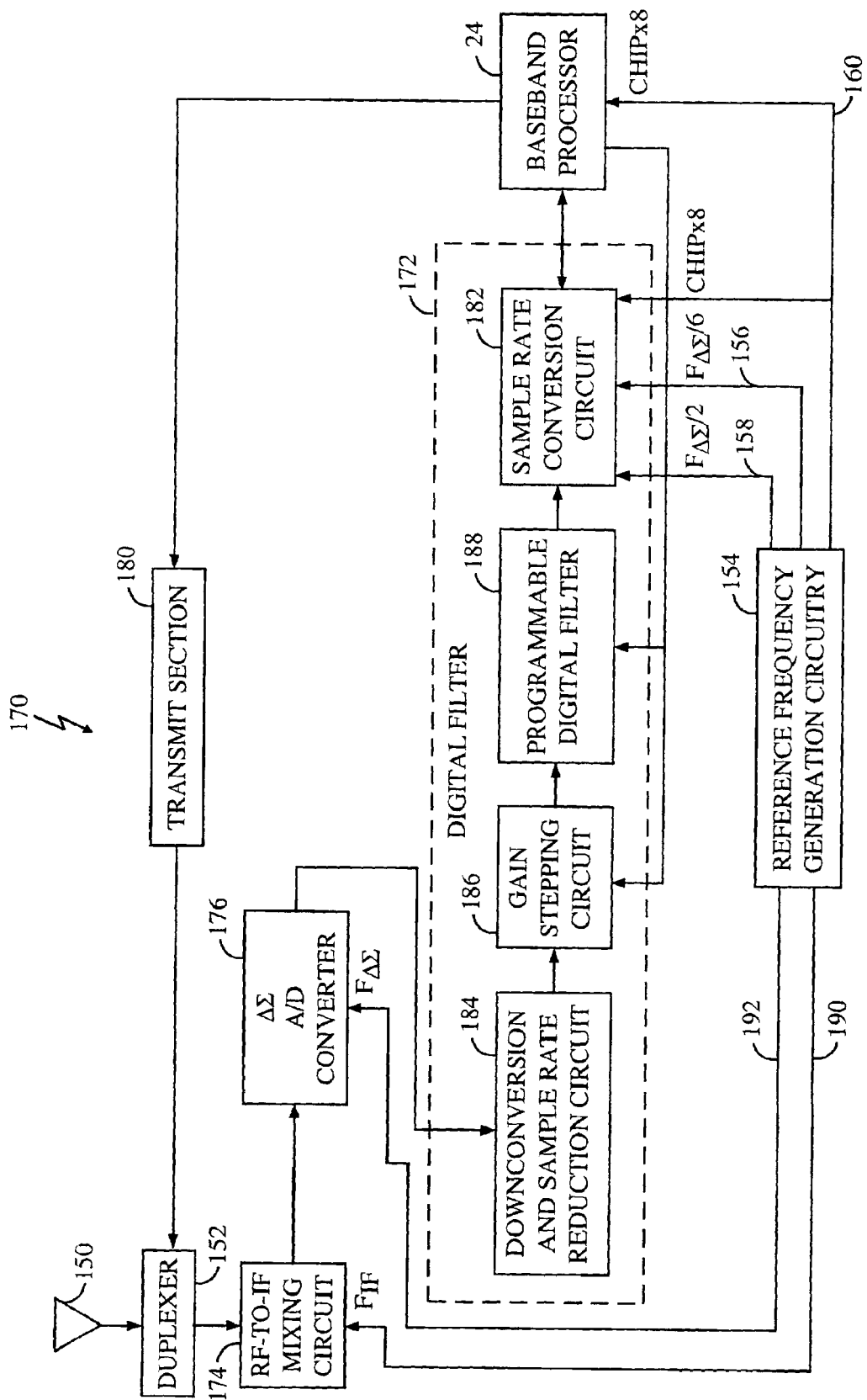
FIG. 6 is a diagram of a mobile transceiver employing the programmable digital filter of FIG. 1 and constructed in accordance with the teachings of the present invention.

FIG. 6 is a diagram of a mobile transceiver 170 employing the programmable digital filter 10 of FIG. 1 and constructed in accordance with the teachings of the present invention. The transceiver 170 includes, from left to right, an antenna 150, a duplexer 152, an RF-to-IF mixing circuit 174, a delta-sigma analog-to-digital converter (ΔΣ ADC) 176, a digital filter 172, and a baseband processor/demodulator 24'. An output of the baseband processor/demodulator 24' is provided to a transmit section 180, the output of which is connected to the duplexer 152. A reference frequency generation circuit 154 is connected to the RF-to-IF mixing circuit 174, the ΔΣ ADC 176, the digital filter 172, and the baseband processor/demodulator 24', and supplies necessary reference frequencies thereto.

The digital filter 172 includes, from left to right, a digital downconversion and sample rate reduction circuit 184, a gain stepping circuit 186, the programmable digital filter 10, and a sample rate conversion circuit 182.

In operation, the antenna 150 is used for both radio transmission and reception. The duplexer 152 facilitates the dual use of the antenna 150 for both reception and transmission. Upon receipt of a radio frequency (RF) signal by the antenna 150, the duplexer 152 directs the received signal to the RF-to-IF mixing circuit 174 where the RF signal is converted to an IF signal. The construction of the RF-to-IF mixing circuit 174 is known in the art.

The resulting IF signal is input to the ΔΣ ADC 176 where it is converted to a digital signal. The ΔΣ ADC 176 includes a delta-sigma modulator in series with a 1-bit digital to analog converter (not shown), the constructions of which are well known in the art. The ΔΣ ADC 176 is chosen to have a high dynamic range so as to prevent undesirable distortion resulting from converting the relatively high frequency IF signal to a digital signal. The ΔΣ ADC 176 outputs a digital IF frequency signal to the digital filter 172.

In the digital filter 172, the digital IF frequency signal is down-converted to baseband frequencies by the downconversion and sample rate reduction circuit 184. The downconversion and sample rate reduction circuit 184 also separates the digital IF frequency signal into digital in-phase (I) and quadrature (Q) signals. The gain of the resulting digital I and Q baseband signals is adjusted in the gain stepping circuit 186. The gain stepping circuit is connected to the baseband processor/demodulator 78.

Subsequently, the programmable digital filter 10 attenuates jammer signals and other undesirable signals in the gain-adjusted I and Q digital baseband signals. The digital programmable filter 10 is also designed to equalize the composite phase response of the digital filter 172, compensate for passband droop, and remove any DC offsets present in the gain-adjusted I and Q digital baseband signals. The power-efficient design of the programmable digital filter 10 helps to relax design constraints on the transceiver 170, facilitating its implementation.

Filtered I and Q signals are output from the programmable digital filter 10 and to the sample rate conversion circuit 182. In the sample rate conversion circuit 182, the sample rate of the I and Q signals is converted to the chip rate, i.e., CHIPx8, in preparation for despreading and further processing in the baseband processor/demodulator 24'. The sample rate converter 182 rate matches the output of the digital filter 172 to the chip rate at the baseband processor/demodulator 24'.

The baseband processor/demodulator 24' also provides the programmable coefficients from a memory (see 26 of FIG. 1) in the baseband processor/demodulator 24', such as a register, to the programmable digital filter 10. In addition, the baseband processor/demodulator 24' outputs data such as voice or other information to the transmit section 180.

The transmit section 180 includes mixers, up-converters, filters, and so on (not shown) and may be constructed by those ordinarily skilled in the art. The transmit section 80 prepares the signal output from the baseband processor/demodulator 24' for radio transmission. The prepared signal is transmitted via the antenna 150 by way of the duplexer 152.

The RF-to-IF mixer 174 requires an IF clock signal 190 that is supplied by the reference frequency generation circuit 154. The ΔΣ ADC 176 requires an FΔΣ clock signal 192 with a frequency of F ΔΣ, which corresponds to the sample rate of signals output from the ΔΣ ADC 176. In the present embodiment, F ΔΣ is in the range of 60 to 80 MHz for CDMA (code division multiple access) signals.

The F ΔΣ clock signal 192 is also supplied by the reference frequency generation circuit 154. Similarly, the reference frequency generation circuit 154 supplies an F ΔΣ/6 clock signal 156, an F ΔΣ/2 clock signal 158, and a CHIPx8 (chip rate) clock signal 160 to the sample rate conversion circuit 182. The CHIPx8 clock signal 160 is also supplied to the baseband processor/demodulator 24'.

The reference frequency generation circuit 154 may be constructed by those ordinarily skilled in the art via one or more direct digital synthesizers and/or phase locked loops and a frequency reference such as a voltage controlled temperature compensated crystal oscillator (VC-TCXO).

The transceiver 170 implements gain adjusting, mixing, and filtering functions in the digital domain via the power-efficient digital filter 172 resulting in significant size and energy consumption advantages. In addition, gain and phase mismatch problems inherent in conventional analog implementations are effectively eliminated in the transceiver 170.

The constructions of a sample rate conversion circuits that may be used for the sample rate conversion circuit 182 are known in the art. However, in the preferred embodiment, the sample rate conversion circuit 182 is constructed in accordance with the teachings of U.S. patent application Ser. No. 09/119,073, filed Jul. 10, 1998, by Mathe et al., entitled LOW-POWER SAMPLE RATE CONVERTER, assigned to the assignee of the present invention and incorporated by reference herein.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A telecommunications system receiver comprising:
   an antenna for receiving a radio signal having a first frequency;
   a mixer for mixing said radio signal to an intermediate frequency signal;
   a delta-sigma analog-to-digital converter for converting said intermediate frequency signal to a digital intermediate frequency signal having a frequency that is substantially higher than chip rate;
   a digital filter for converting said digital intermediate frequency signal to a digital baseband signal, said digital filter performing digital filtering with a programmable filter response; and
   a baseband processor for processing said digital baseband signal.

2. The invention of claim 1 wherein said digital filter includes a first finite impulse response filter section for receiving an input signal, said first finite impulse response filter section having a first transfer function with a first programmable coefficient.

3. The invention of claim 2 wherein said digital filter further includes an infinite impulse response filter section connected to said first finite impulse response filter section, said infinite impulse response filter section having a second transfer function with a second programmable coefficient.

4. The invention of claim 3 wherein said digital filter further includes a second finite impulse response filter section connected to said infinite impulse response filter section for outputting a filtered output signal in response the receipt of said input signal by said digital filter, said second finite impulse response filter section having a third transfer function with a third programmable coefficient.

5. The invention of claim 1 wherein said baseband processor includes means for demodulating and/or despreading said digital baseband signal.

6. The invention of claim 1 wherein said digital filter includes means for rejecting jammer signals in said digital intermediate frequency signal.

7. The invention of claim 1 wherein said digital filter includes a sample rate converter.

8. The invention of claim 1 wherein said digital filter includes means for removing DC bias in said digital baseband signal.

9. The invention of claim 1 wherein said digital filter includes means for adjusting the gain of said digital baseband signal.

10. The invention of claim 1 wherein said digital filter includes a finite impulse response (FIR) filter section having a plurality of FIR filters coupled in series, each FIR filter having at least one programmable coefficient.

11. The invention of claim 1 wherein said digital filter includes a finite impulse response (FIR) filter section having a plurality of FIR filters operative to perform lowpass filtering.

12. The invention of claim 1 wherein said digital filter includes an infinite impulse response (IIR) filter section having a plurality of IIR filters coupled in series, each IIR filter having at least one programmable coefficient.

13. The invention of claim 1 wherein said digital filter includes an infinite impulse response (IIR) filter section having a plurality of IIR filters operative to perform equalization.

14. A transceiver comprising:
   an antenna for receiving a radio signal;
   a mixer for mixing said radio signal to an intermediate frequency signal;
   a delta-sigma analog-to-digital converter for converting said intermediate frequency signal to a digital intermediate frequency signal having a frequency that is substantially higher than chip rate;
   a digital filter for converting said digital intermediate frequency signal to a digital baseband signal, said digital filter performing digital filtering with a programmable filter response;
   a baseband processor for processing said digital baseband signal and outputting a signal; and
   a transmitter for transmitting said signal.

* * * * *